(12) United States Patent
Zhan et al.

(10) Patent No.: US 10,600,702 B2
(45) Date of Patent: Mar. 24, 2020

(54) TEST ELEMENT GROUP AND SEMICONDUCTOR WAFER INCLUDING THE SAME

(71) Applicant: Samsung Electronics Co., Ltd., Suwon-si, Gyeonggi-do (KR)

(72) Inventors: Zhan Zhan, Suwon-si (KR); Ju Hyun Kim, Suwon-si (KR); Sung Gun Kang, Suwon-si (KR); Hwa Sung Rhee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/148,424

(22) Filed: Oct. 1, 2018

(65) Prior Publication Data

US 2019/0304856 A1    Oct. 3, 2019

(30) Foreign Application Priority Data

Mar. 29, 2018    (KR) .................. 10-2018-0036600

(51) Int. Cl.
| | | |
|---|---|---|
| *H01L 23/528* | (2006.01) | |
| *H01L 21/66* | (2006.01) | |
| *H01L 27/092* | (2006.01) | |
| *G01R 31/28* | (2006.01) | |
| *H01L 29/08* | (2006.01) | |

(52) U.S. Cl.
CPC .......... *H01L 22/34* (2013.01); *G01R 31/2884* (2013.01); *H01L 22/32* (2013.01); *H01L 23/528* (2013.01); *H01L 27/092* (2013.01); *H01L 29/0847* (2013.01)

(58) Field of Classification Search
CPC ....... H01L 22/24; H01L 22/32; H01L 23/528; H01L 27/092; H01L 29/0847
See application file for complete search history.

(56) References Cited

U.S. PATENT DOCUMENTS

| | | | | |
|---|---|---|---|---|
| 5,883,838 | A * | 3/1999 | McClure | G11C 7/06 365/189.05 |
| 5,936,899 | A * | 8/1999 | Jeong | G11C 29/34 365/201 |
| 6,392,251 | B1 | 5/2002 | McCarthy | |
| 7,317,326 | B2 | 1/2008 | Nakano | |
| 7,622,943 | B2 * | 11/2009 | Miyagawa | G09G 3/006 324/760.02 |
| 7,768,484 | B2 * | 8/2010 | Huang | G09G 3/3241 345/52 |
| 2008/0211540 | A1 * | 9/2008 | Fujita | H03K 19/17748 326/47 |

(Continued)

FOREIGN PATENT DOCUMENTS

| | | |
|---|---|---|
| JP | 06018629 | 1/1994 |
| JP | 2005024253 | 1/2005 |

(Continued)

*Primary Examiner* — Nathan W Ha
(74) *Attorney, Agent, or Firm* — Myers Bigel, P.A.

(57) ABSTRACT

A test element group includes a test element including a plurality of test transistors connected in series between a first node and a second node, the second node being connected to a ground node; a first transistor connected between the first node and a power supply node; and a second transistor configured to generate an output current, proportional to a voltage at the first node, and connected to the first node and the power supply node.

20 Claims, 12 Drawing Sheets

(56) References Cited

U.S. PATENT DOCUMENTS

| | | | | |
|---|---|---|---|---|
| 2008/0232181 A1* | 9/2008 | Higashi | ............... | G11C 7/1051 |
| | | | | 365/201 |
| 2010/0103155 A1* | 4/2010 | Nishimura | ............... | G09G 3/20 |
| | | | | 345/211 |
| 2014/0267854 A1* | 9/2014 | Shishido | ............... | H04N 5/378 |
| | | | | 348/300 |
| 2017/0294774 A1* | 10/2017 | Illing | ................ | H02H 6/005 |

FOREIGN PATENT DOCUMENTS

| JP | 2006349616 | 12/2006 |
|---|---|---|
| JP | 2007309893 | 11/2007 |
| JP | 2008016080 | 1/2008 |

* cited by examiner

TEST ELEMENT GROUP AND SEMICONDUCTOR WAFER INCLUDING THE SAME

CROSS-REFERENCE TO RELATED APPLICATION

This application claims priority to Korean Patent Application No. 10-2018-0036600 filed on Mar. 29, 2018 in the Korean Intellectual Property Office, the disclosure of which is incorporated herein by reference in its entirety.

BACKGROUND

1. Field

The present inventive concept relates to a test element group, and, more particularly, to a semiconductor wafer including the same.

2. Description of Related Art

In a process of manufacturing or fabricating a semiconductor device using a semiconductor wafer, a test element group for verifying the manufacturing or fabrication process may be provided on the wafer. The test element group may be provided in a limited region in which an integrated circuit chip to be manufactured is not formed, and may include a plurality of elements to be tested. As the number of devices included in a test element group increases, the number of fabrication processes that may be verified may also increase. Therefore, various methods for accurately verifying a fabrication process by incorporating as many elements as possible into a limited region of a semiconductor wafer have been studied.

SUMMARY

Some embodiments of the present inventive concept may provide a test element group for verifying whether a fault occurs in a process of forming a contact connected to a drain/source region by using a test element in which a plurality of test transistors are connected in series, and a semiconductor wafer including the same.

According to some embodiments of the present inventive concept, a test element group comprises a test element comprising a plurality of test transistors connected in series between a first node and a second node, the second node being connected to a reference node; a first transistor connected between the first node and a power supply node; and a second transistor configured to generate an output current, proportional to a voltage at the first node, and connected to the first node and the power supply node.

According to some embodiments of the present inventive concept, a test element group comprises a first transistor configured to control a voltage of a first node, and connected between a power supply node and the first node; a second transistor configured as a source-follower amplifier and further configured to generate an output current proportional to the voltage of the first node; and a test element comprising a plurality of test transistors connected in series between the first node and a reference node, wherein the plurality of test transistors provide a discharge path for the voltage of the first node when the first transistor transitions from an on state to an off state.

According to some embodiments of the present inventive concept, a semiconductor wafer comprises a plurality of chip regions comprising a plurality of semiconductor elements; and a separation region between the plurality of chip regions and having a plurality of test element groups, wherein each of the plurality of test element groups comprises: a first pad configured to receive a power supply voltage; a test element comprising a plurality of test transistors connected in series between a first node and a second node, gate electrodes of the plurality of test transistors being connected to a second pad, different from the first pad; a first transistor configured to control a voltage of the first node and having a gate electrode connected to a third pad; and a second transistor configured to generate an output current determined by a voltage of the first node.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

A semiconductor wafer may have a chip region and a separation region that may include test elements that are formed using the same processes used to form the elements in the chip region. These test elements may be the subject of testing to determine whether an open fault has been caused during the fabrication process, which involves the separation of drain/source region from a contact. One technique for determining whether an open fault exists is by applying a voltage to a plurality of test transistors and detecting the current flow. Such a test operation may be difficult, however, when the number of test transistors is relatively large and may be less accurate when the number of test transistors is reduced. Some embodiments of the inventive concept stem from a realization that a plurality of test transistors may be used as a discharge path for a node that has been charged to an initial voltage. A determination of whether an open fault exists may be based on the rate of discharge of the node voltage. The voltage at the node may be based on an output current of a transistor that is configured to operate as a source-follower amplifier based on the node voltage.

Figure 1:
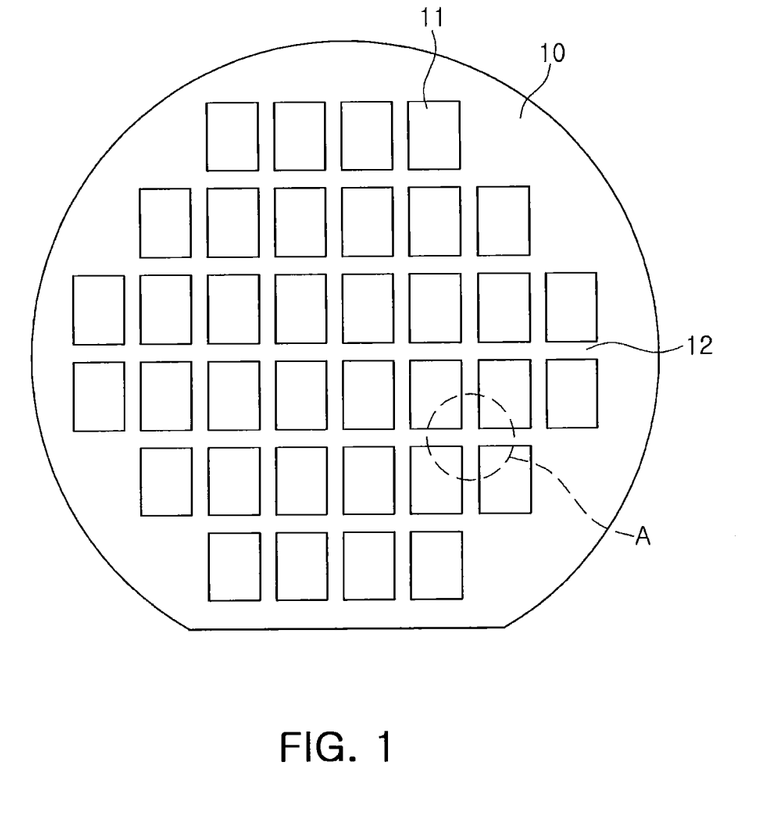
FIG. 1 is a plan view illustrating a semiconductor wafer according to some embodiments of the present inventive concept.

FIG. 1 is a plan view illustrating a semiconductor wafer according to some embodiments of the present inventive concept.

Referring to FIG. 1, a semiconductor device 10, according to some embodiments, may include a plurality of chip regions 11 in which an integrated circuit chip is formed, and separation regions 12 defined by each of the plurality of chip regions 11. Each of the plurality of chip regions 11 may include at least one integrated circuit chip. For example, various circuit elements, such as a resistor, a capacitor, a transistor, a diode, or the like may be formed in each of the plurality of chip regions 11. The plurality of chip regions 11 may be arranged in a plurality of rows and columns.

The separation regions 12 may be regions used for forming the integrated circuit chips by separating the plurality of chip regions 11 from each other by a scribing process. Therefore, the circuit elements included in the integrated circuit chip may not also be disposed in the separation regions 12. In consideration of efficiency and reliability of the scribing process, the separation regions may be defined as a plurality of straight lines defined by each of the plurality of chip regions 11 arranged along a plurality of rows and columns.

A plurality of semiconductor fabrication processes may be performed to form an integrated circuit chip in the plurality of chip regions 11. Open or short faults may occur when one or more processes of a plurality of semiconductor fabrication processes are performed improperly, which may be a factor in degrading a performance metric of the integrated circuit chip. Thus, during manufacture of the integrated circuit chip, a method, according to some embodiments of the inventive concept, may be used to determine whether each of the plurality of semiconductor fabrication processes has been properly performed.

In some embodiments, a test element may be provided in the separation regions 12 to determine suitability of the semiconductor process for fabricating the integrated circuit chip. The test element may be an element formed together with another element, such as a capacitor, a resistor, or a transistor included in the integrated circuit chip. In some embodiments, in the process of forming a resistor in the integrated circuit chip, test transistors for conducting a test process in the separation regions 12 may be formed. The test transistors may be connected to the pads formed in the separation regions 12. A test device used in performing a test process may determine whether the test transistors are defective by detecting a current and/or a voltage from at least one of the pads.

Figure 2:
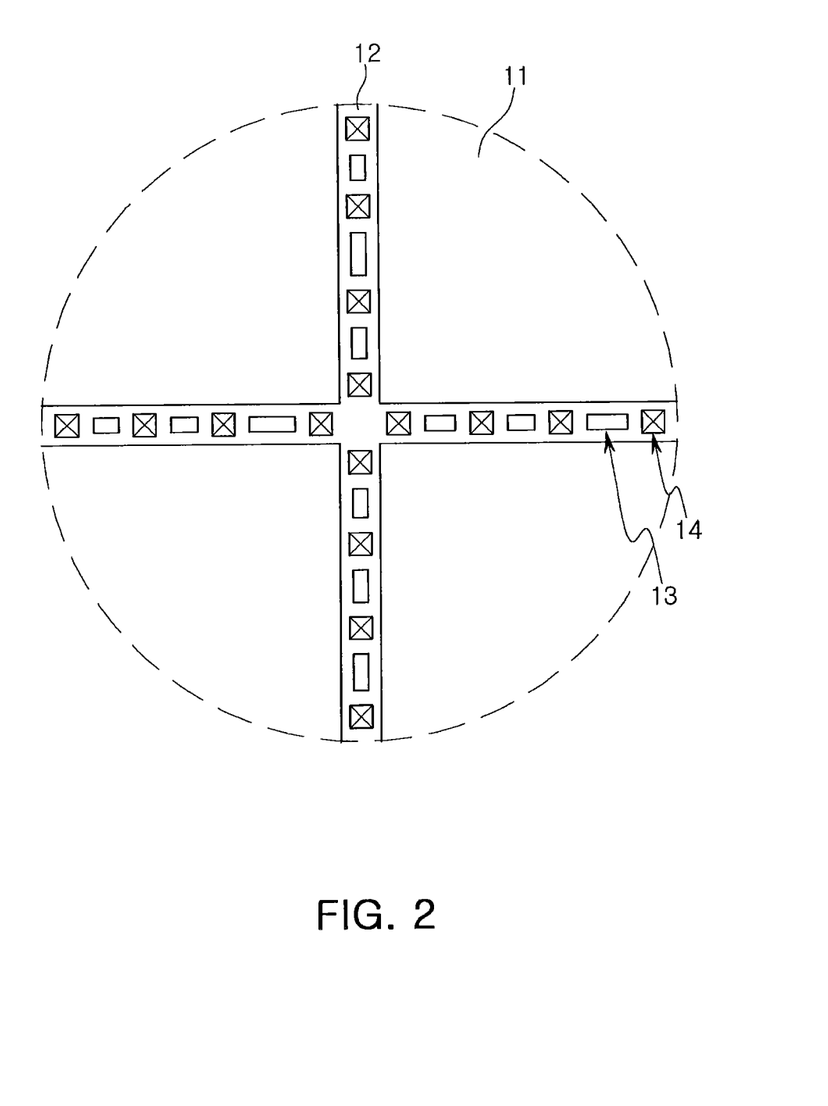
FIG. 2 is an enlarged view of region A in FIG. 1.

FIG. 2 is an enlarged view of region A in FIG. 1.

Referring to FIG. 2, a separation region 12 may be defined by each of a plurality of chip regions 11 adjacent to each other, and a plurality of test element groups 13 and a plurality of pads 14 may be formed in the separation region 12. Each of the plurality of test element groups 13 may include a plurality of test elements for testing, and the plurality of test elements may be connected to at least one of the plurality of pads 14.

For example, the plurality of test elements may include a transistor, a resistor, a capacitor, a metal line, or the like. The plurality of test elements may be formed together as part of a process of forming a transistor, a resistor, a capacitor, a metal line, or the like in the plurality of chip regions 11. For example, according to some embodiments, the plurality of chip regions 11 and separation regions 12 may be defined in a wafer, and elements may be formed in at least a portion of the plurality of chip regions 11, while a plurality of test elements for conducting a test process may be formed in the separation regions 12 as part of the same fabrication process or operation. In other words, one or more fabrication operations may contribute to the simultaneous formation of both an element in the one of the plurality of chip regions 11 and a test element in one of the separation regions 12.

In some embodiments, when a plurality of transistors are formed in the plurality of chip regions 11, a plurality of test transistors corresponding to the plurality of transistors may be formed in the separation regions 12 at the same time. In a test process for verifying whether a plurality of transistors formed in the plurality of chip regions 11 is defective or not, the test device may input a voltage and/or a current to the plurality of test transistors formed in the separation regions 12. The test device may determine whether a plurality of transistors formed in the plurality of chip regions 11 is defective or not, by inputting a voltage and/or a current to a plurality of test transistors, and measuring a voltage and/or a current detected in response thereto.

Figure 3A:
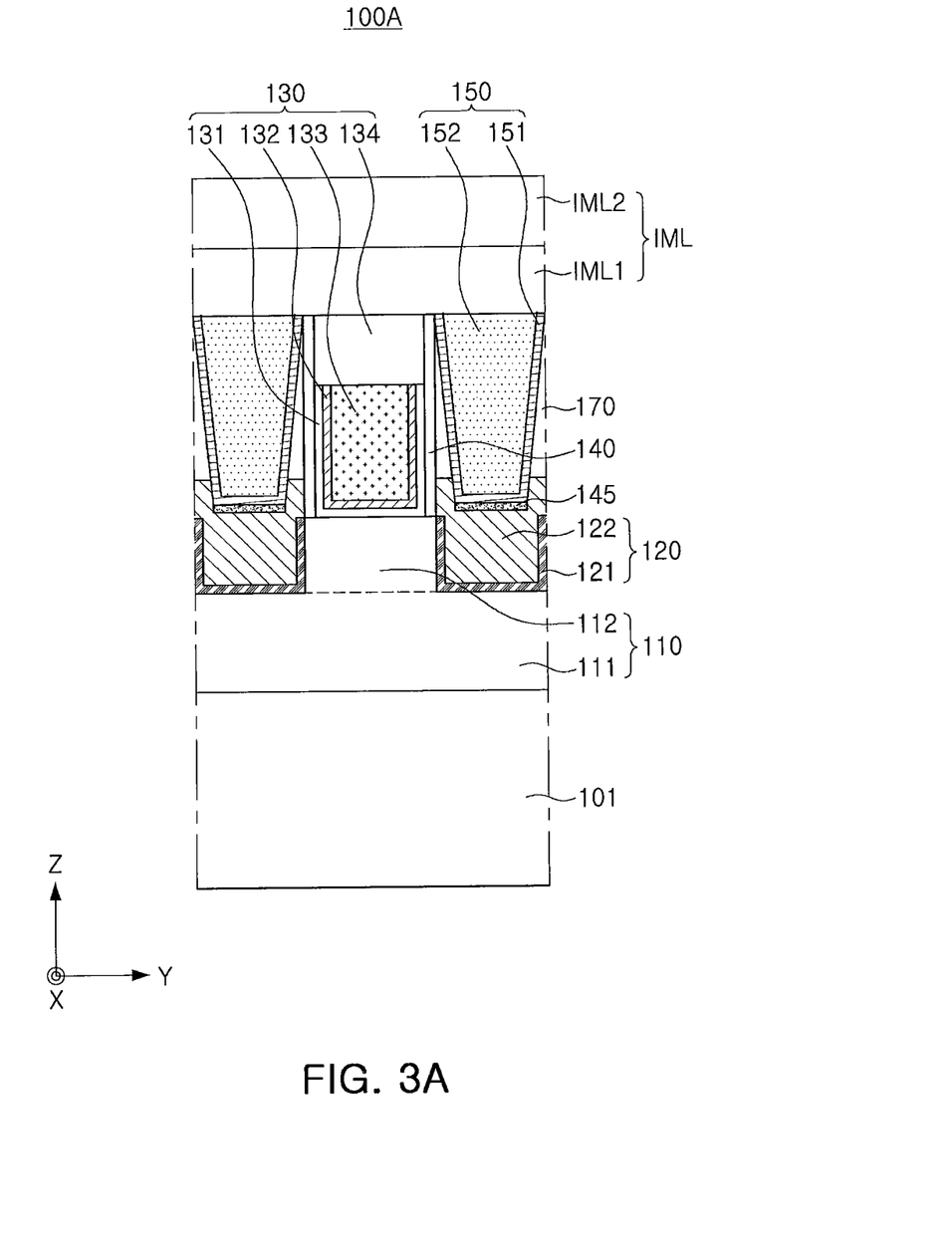
FIGS. 3A and 3B are cross-sectional views illustrating an open fault that may occur in a semiconductor wafer according to some embodiments of the present inventive concept.
Figure 3B:
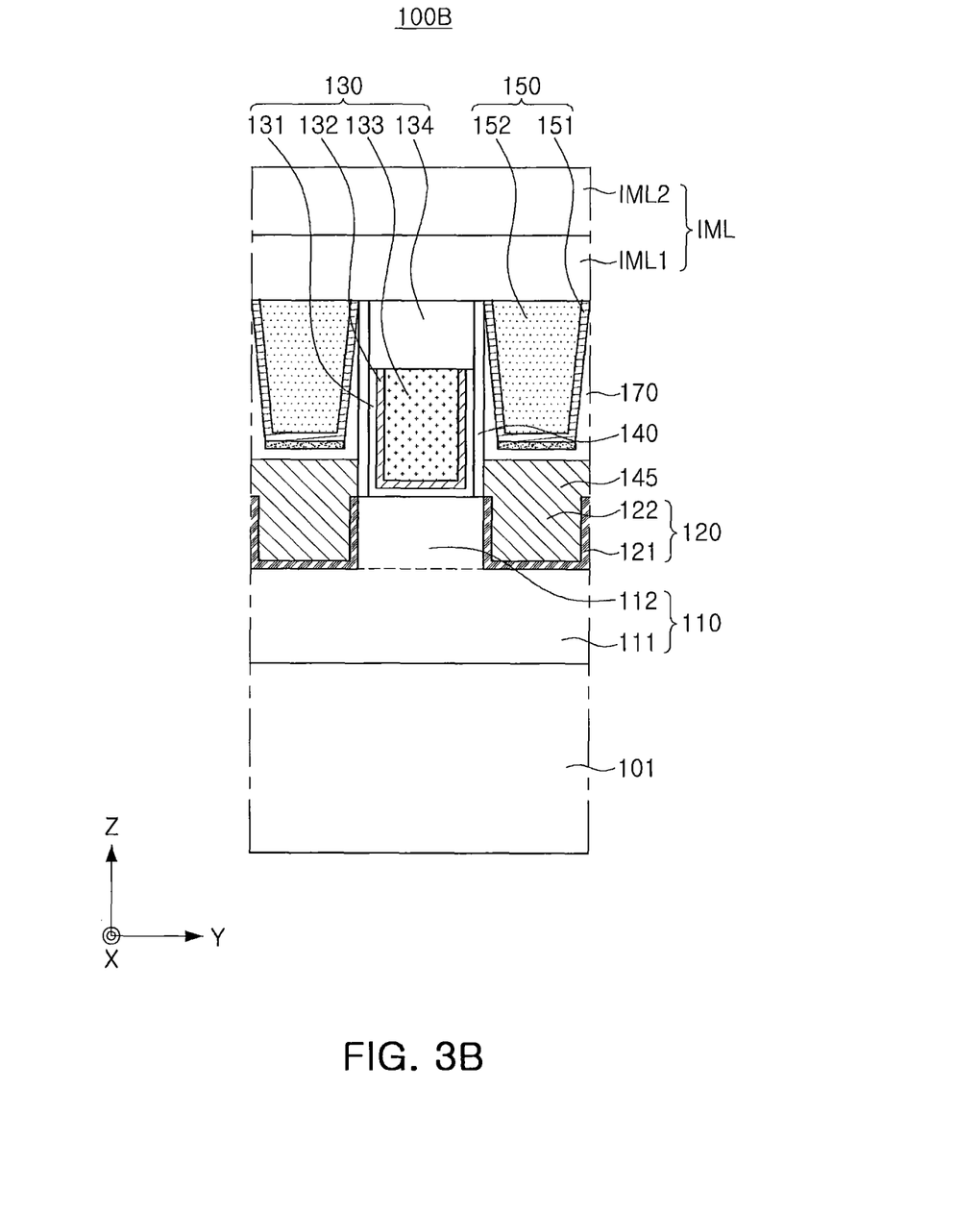

FIGS. 3A and 3B are cross-sectional views illustrating an open fault that may occur in a semiconductor wafer according to some embodiments of the present inventive concept.

Referring to FIG. 3A, a transistor 100A may include a drain/source region 120 and a gate electrode 130, which are formed on a pin structure 110 of a semiconductor substrate 101. The pin structure 110 may include a first region 111 extending from the semiconductor substrate 101, and a second region 112 extending from the first region 111. The gate electrode 130 may be formed to cross over the second region 112 on the first region 111. Meanwhile, the drain/source region 120 may extend from the first region 111, and the drain/source region 120 may be formed by applying a selective epitaxial growth process to the first region 111, for example. The drain/source region 120 may include a first layer 121 and a second layer 122.

The gate electrode 130 may be formed between spacers 140, and may include a gate insulating layer 131, a first gate metal layer 132, a second gate metal layer 133, a capping layer 134, and the like. A stacked structure of the gate electrode 130 may be variously modified according to example embodiments. In one example, at least one of the first gate metal layer 132 and the second gate metal layer 133 may comprise a plurality of layers.

The drain/source region 120 may be connected to a contact 150. The contact 150 may be formed by removing a portion of an interlayer insulating layer 170 formed to surround the gate electrode 130 by an etching process, and filling a space in which the interlayer insulating layer 170 is removed with a conductive material. The contact 150 may have a first contact layer 151 and a second contact layer 152, wherein the first contact layer 151 may be a barrier metal layer, and the second contact layer 152 may be a fill metal layer. For example, an upper surface of the contact 150 may be formed so as to be co-planar with an upper surface of the gate electrode 130, and an upper insulating layer IML may be formed on the upper surfaces of the gate electrode 130 and the contact 150. The upper insulating layer IML may include a plurality of layers IML1 and IML2, and metal lines may be formed in the upper insulating layer IML.

Next, referring to FIG. 3B, an open fault may occur in which a contact 150 and a drain/source region 120 are not connected to each other, which may be due to an error occurring in a process of forming a transistor 100B. As described above, the contact 150 may be formed by removing a portion of an interlayer insulating layer 170 by an etching process, and filling a space in which the interlayer insulating layer 170 is removed with a conductive material. Therefore, when the interlayer insulating layer 170 is not sufficiently removed by the etching process, an open fault may occur in which the contact 150 and the drain/source region 120 are separated as illustrated in FIG. 3B.

In some embodiments, the open fault in which the contact 150 and the drain/source region 120 are separated from each other may be effectively detected by using a test element group formed in a separation region. In some embodiments, when transistors are formed in a plurality of chip regions, test transistors may be formed together in the separation regions between the plurality of chip regions. The test transistors may be connected in series with each other, and the test transistors in a test process may operate as a kind of pass gate. For example, a test device that conducts a test process may determine whether there is an open fault by detecting a current flowing through the test transistors connected in series.

Figure 4:
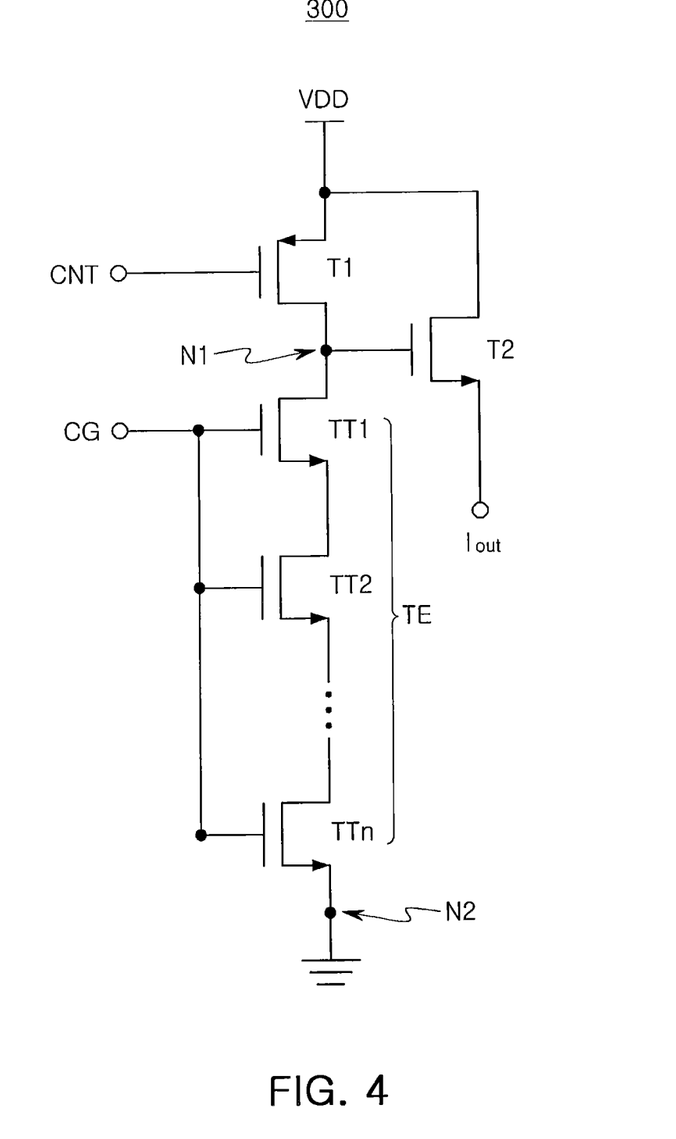
FIGS. 4 and 5 are schematic diagrams illustrating a test element group according to some embodiments of the present inventive concept.
Figure 5:
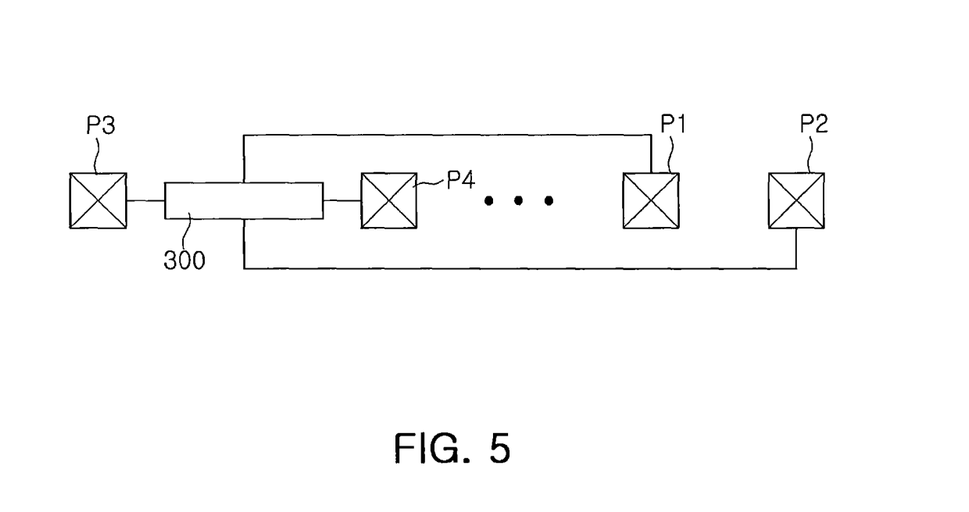

FIGS. 4 and 5 are schematic diagrams illustrating a test element group according to some embodiments of the present inventive concept.

Referring to FIG. 4, a test element group 300 according to some embodiments may include a test element TE, a first transistor T1, and a second transistor T2. The test element TE may include a plurality of test transistors TT1-TTn connected in series between a first node N1 and a second node N2, and the second node N2 may include a ground or reference voltage GND. For example, the plurality of test transistors TT1-TTn may be NMOS transistors, and the gate electrodes of the plurality of test transistors TT1-TTn may provide a single common gate electrode CG.

The first transistor T1 may be connected between a power supply node supplying a power supply voltage VDD and the first node N1. The first transistor T1 may receive a controlling signal CNT through the gate electrode, and may be turned on and turned off by the controlling signal CNT. The second transistor T2 may operate as a source-follower amplifier by a voltage of the first node N1, and may generate an output current $I_{OUT}$ that may be proportional to the voltage of the first node N1. The first transistor T1 may be a PMOS transistor, and the second transistor T2 may be an NMOS transistor.

A test element group 300 according to some embodiments illustrated in FIG. 4 may be provided to determine whether an open fault is present in the test element TE connected in series with the plurality of test transistors TT1-TTn. For example, drain and source regions of adjacent test transistors TT1-TTn may be connected to each other by contacts and metal lines, and an open fault may result from the drain and/or source regions not being connected to the contacts.

During the test operation, the test element group 300 may be connected to the test device through a plurality of pads. The test device may detect the output current $I_{OUT}$, while turning on the plurality of test transistors TT1-TTn of the test element TE and turning on and off the first transistor T1, to determine the presence or absence of the open fault.

Referring to FIG. 5, a test element group 300 may be connected to first to fourth pads P1-P4. For example, the first pad P1 may be connected to a power supply node and supply a power supply voltage VDD, and the second pad P2 may be connected to a common gate electrode CG of a plurality of test transistors TT1-TTn. The third pad P3 may be connected to a gate electrode of a first transistor T1, and the fourth pad P4 may be connected to a source terminal or source region of a second transistor T2 to detect an output current $I_{OUT}$.

During a test process, a test device may input a power supply voltage VDD to the first pad P1, and input a voltage corresponding to a high logic value capable of turning on the plurality of test transistors TT1-TTn to the second pad P2.

The test device may input a controlling signal CNT through the third pad P3 to sequentially turn on and off the first transistor T1, while the plurality of test transistors TT1-TTn are turned on, the output current $I_{OUT}$ may be detected through the fourth pad P4 while the first transistor T1 is turned off. The test device may determine whether there is an open fault in which at least one of the plurality of test transistors TT1-TTn is separated from a drain region and/or a source region, based on the output current $I_{OUT}$.

FIGS. 6A, 6B, 6C, and 7 are schematic diagrams illustrating operations of a test element group according to some embodiments of the present inventive concept.

Figure 6A:
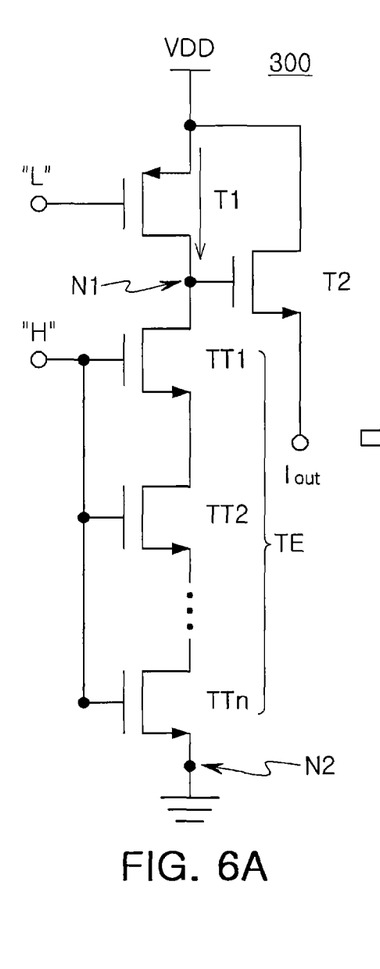
FIGS. 6A, 6B, 6C, and 7 are schematic diagrams illustrating operations of a test element group according to some embodiments of the present inventive concept.

Referring to FIG. 6A, to proceed with a test operation, a high logic value H may be commonly input to the gate electrodes of the plurality of test transistors TT1-TTn to turn on a plurality of test transistors TT1-TTn. The test device may input a low logic value L to a gate electrode of a first transistor T1 to turn on the first transistor T1. As the first transistor T1 is turned on, a power supply voltage VDD may be input to the first node N1, and a voltage of the first node N1 may rise.

Because a turn-on resistance of the plurality of test transistors TT1-TTn is much greater than a turn-on resistance of the first transistor T1, a voltage of the first node N1 may be raised by the power supply voltage VDD, although the plurality of test transistors TT1-TTn are turned on. As the voltage of the first node N1 increases, the output current $I_{OUT}$ generated by the second transistor T2, which operates as a source-follower amplifier, may increase.

Figure 6B:
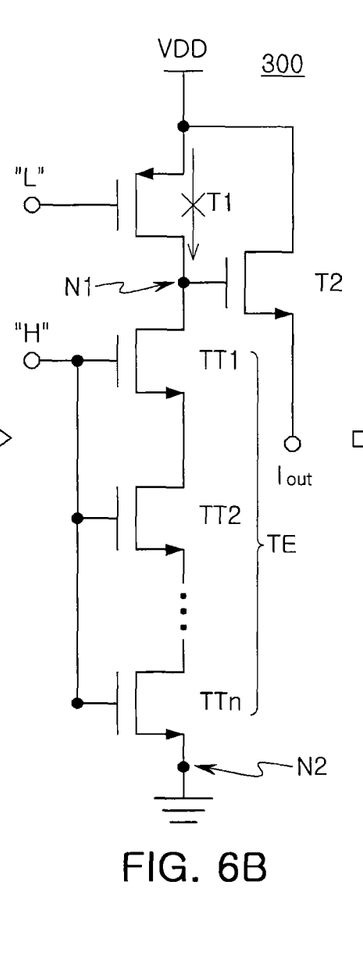
Figure 6C:
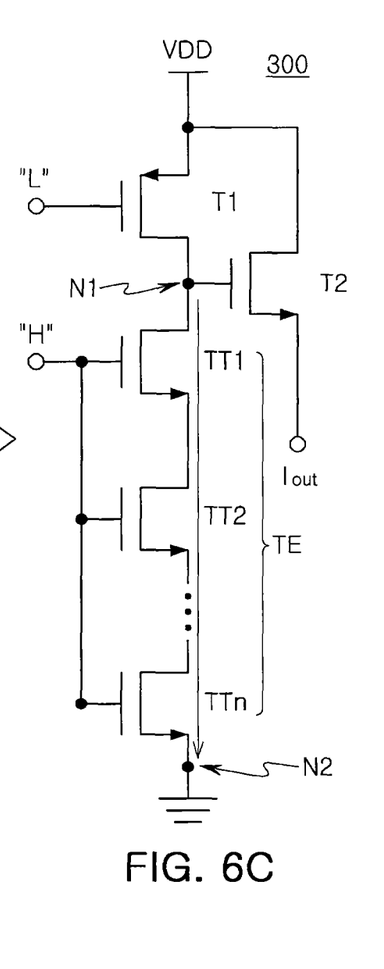

Next, referring to FIGS. 6B and 6C, the test device may input a high logic value H to the gate electrode of the first transistor T1 to turn off the first transistor T1. As the first transistor T1 is turned off, the voltage of the first node N1 may be discharged through the plurality of test transistors TT1-TTn. For example, the plurality of test transistors TT1-TTn may operate as pass gates.

At this time, based on whether there is an open fault in the plurality of test transistors TT1-TTn, the rate at which the voltage of the first node N1 is discharged may vary, and the test device may detect a decrease characteristic of the output current $I_{OUT}$ to estimate a discharge rate of the voltage of the first node N1. Thus, the test device may determine whether there is an open fault in the plurality of test transistors TT1-TTn based on the decrease characteristic of the output current $I_{OUT}$.

When there is no open fault in the plurality of test transistors TT1-TTn, the voltage of the first node N1 may rapidly decrease after the first transistor T1 is turned off. Conversely, when there is an open fault in the plurality of test transistors TT1-TTn, it may take a relatively long time for the voltage of the first node N1 to discharge after the first transistor T1 is turned off. In some embodiments, the test device may determine whether there is an open fault in the plurality of test transistors TT1-TTn, by comparing a magnitude of the output current $I_{OUT}$ with a reference magnitude after a predetermined time is elapsed after the first transistor T1 is turned off.

Figure 7:
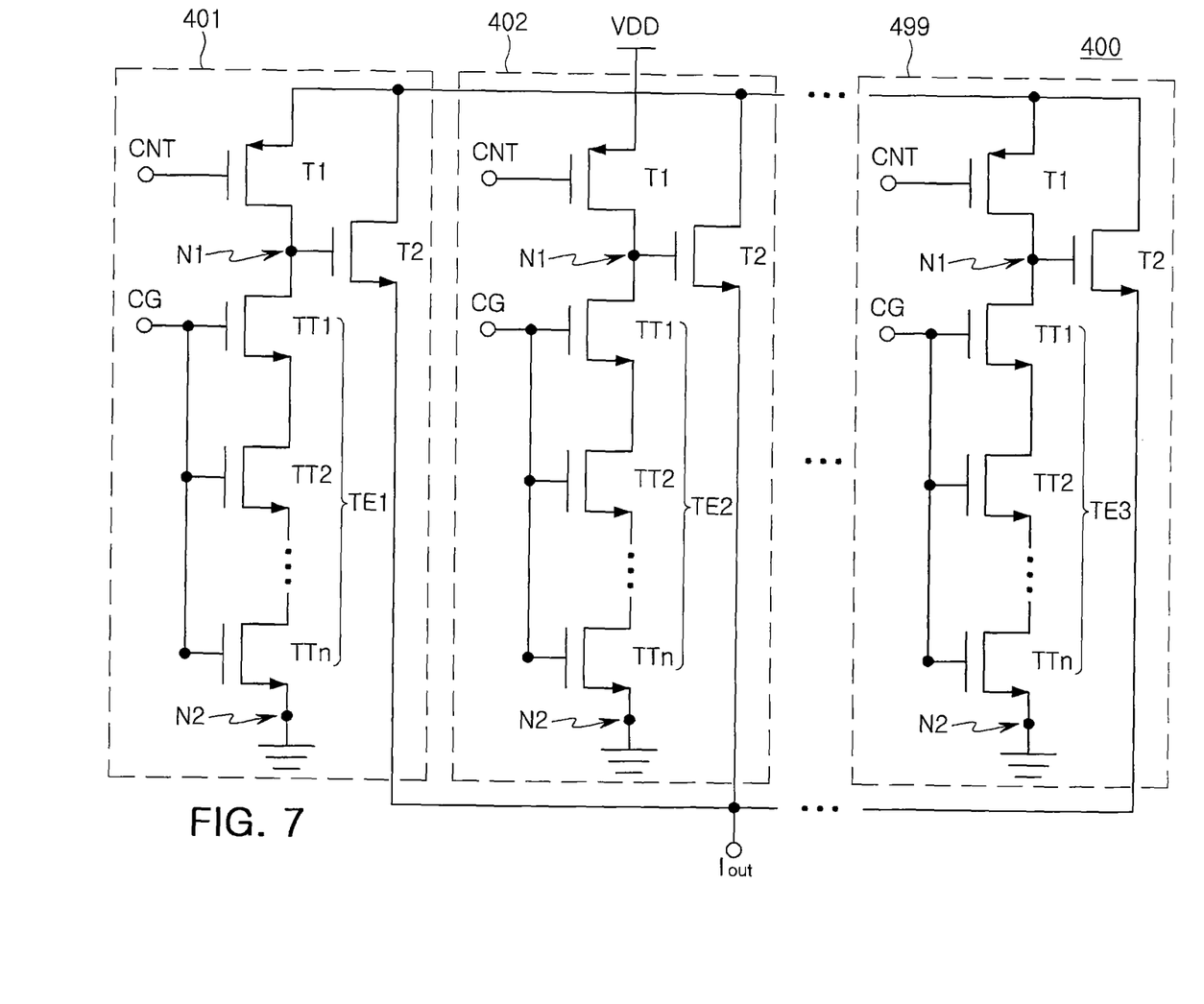

Referring next to FIG. 7, a test element group 400 according to some embodiments may include a plurality of unit test element groups 401-499. Although it is assumed that 99 unit test element groups 401-499 are included in the test element group 400 in the embodiment illustrated in FIG. 7, the number of the unit test element groups 401-499 may vary in accordance with different embodiments of the inventive concept.

The unit test element groups 401-499 may be connected to each other in parallel, and may share pads with each other.

In one example, a power supply node for supplying a power supply voltage VDD to the unit test element groups 401-499 may be connected to a single first pad, and gate electrodes of the plurality of test transistors TT1-TTn may be connected to a single second pad. Similarly, a gate electrode of a first transistor T1 may be connected to a single third pad, and a source region of a second transistor T2 for outputting an output current $I_{OUT}$ may be connected to a single fourth pad. Therefore, it may be possible to detect an open fault existing in a large number of test elements, e.g., TE1-TE99, using the four pads. As a result, a degree of integration of the test element group formed in the separation region of the semiconductor wafer may be increased.

Figure 8:
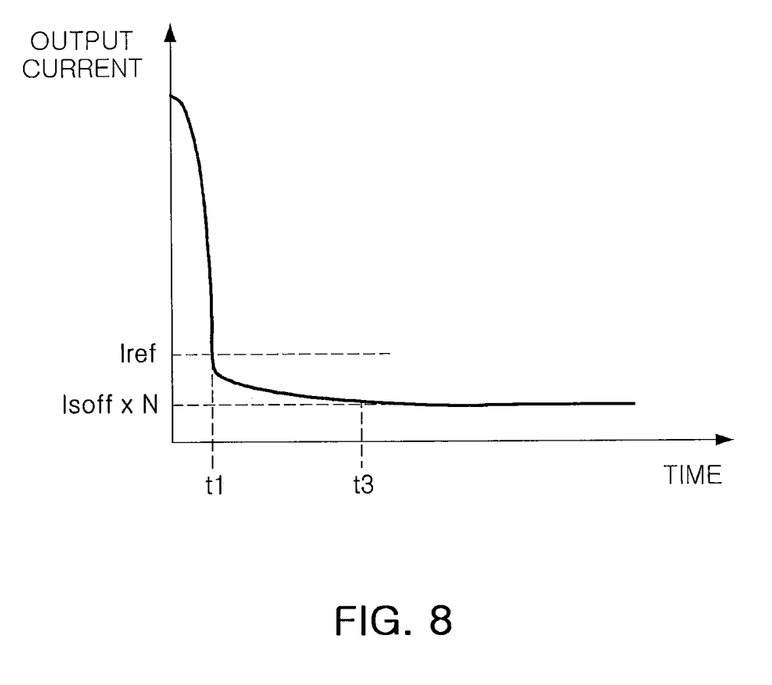
FIGS. 8 and 9 are graphs illustrating operations of a test element group according to some embodiments of the present inventive concept.
Figure 9:
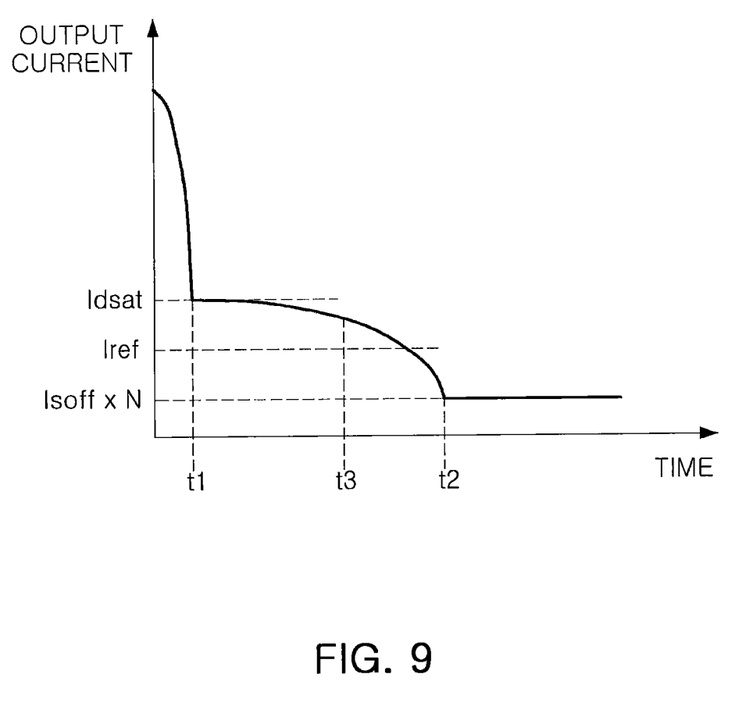

FIGS. 8 and 9 are graphs illustrating operations of a test element group according to some embodiments of the present inventive concept. For example, FIGS. 8 and 9 may be a result of the progress graph of the test process using a test element group 400 as a subject in accordance with the embodiments illustrated in FIG. 7.

First, FIG. 8 is a graph showing a decrease characteristic of an output current $I_{OUT}$ when there is no open fault in a plurality of test transistors TT1-TTn according to some embodiments of the inventive concept. When there is no open fault, an output current $I_{OUT}$ may rapidly decrease after a first transistor T1 is turned off. For example, as illustrated in FIG. 8, the output current $I_{OUT}$ at a first time point t1 may be reduced to close to an off current level of the plurality of test transistors TT1-TTn. However, due to the off current of the plurality of test transistors TT1-TTn, the output current $I_{OUT}$ may not decrease to zero even after a sufficient time has elapsed.

Next, FIG. 9 is a graph showing a reduction characteristic of an output current $I_{OUT}$ when there is an open fault in at least one of a plurality of test transistors TT1-TTn according to some embodiments of the inventive concept. When there is an open fault in at least one of the plurality of test transistors TT1-TTn, a voltage at the first node N1 will not discharge quickly, and therefore the output current $I_{OUT}$ may also slowly decrease. Referring to FIG. 9, the output current $I_{OUT}$ may decrease to a saturation current Idsat level at a first time point t1, and then gradually decrease to be equal to an off current of the plurality of test transistors TT1-TTn at a second time point t2.

Therefore, in some embodiments, at a third time point t3 between the first time point t1 and the second time point t2, the test device may determine whether there is an open fault in at least one of the plurality of test transistors TT1-TTn by comparing a predetermined reference magnitude Iref and a magnitude of the output current $I_{OUT}$. As illustrated in FIGS. 8 and 9, when the magnitude of the output current $I_{OUT}$ at the third time point t3 is greater than the reference magnitude Iref, a determination may be made that there is an open default in at least one of the plurality of test transistors TT1-TTn. Conversely, when the magnitude of the output current $I_{OUT}$ at the third time point t3 is less than the reference magnitude Iref, determined determination may be made that there is no open fault in the plurality of test transistors TT1-TTn.

FIGS. 10A, 10B, 10C, 11A, 11B, and 11C are schematic diagrams illustrating operations of a test element group according to some embodiments of the present inventive concept.

Figure 10A:
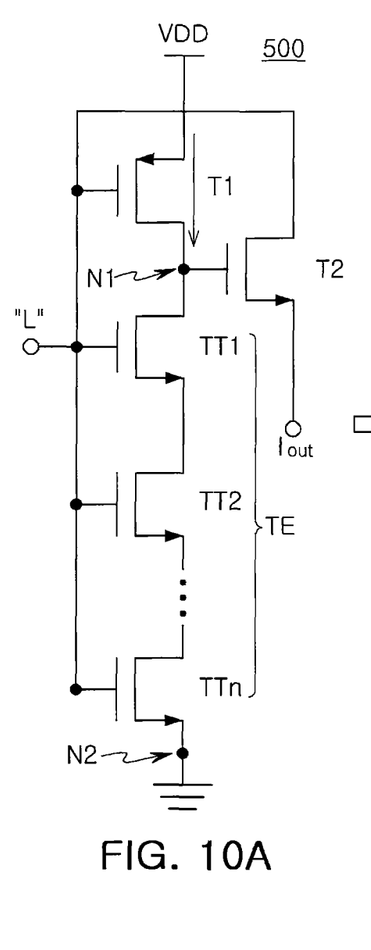
FIGS. 10A, 10B, 10C, 11A, 11B, and 11C are schematic diagrams illustrating operations of a test element group according to some embodiments of the present inventive concept.
Figure 10B:
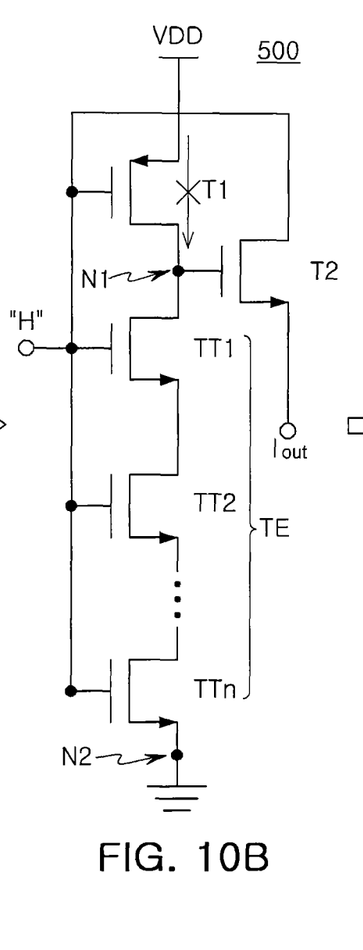
Figure 10C:
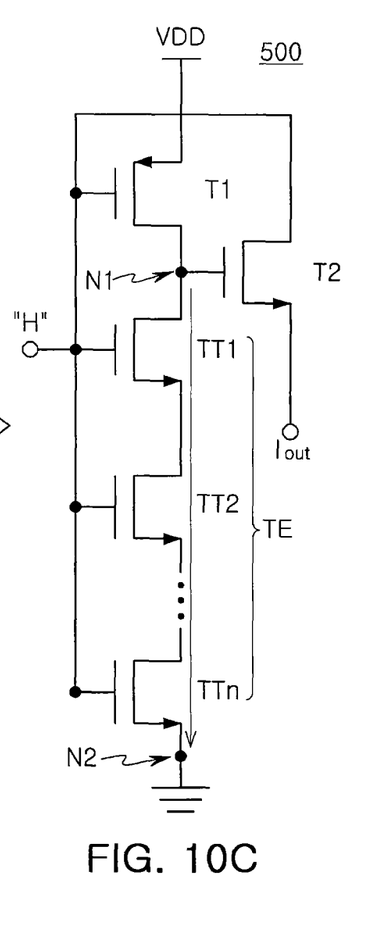

Referring to FIGS. 10A, 10B, and 10C, a test element group 500 may include a test element TE having a plurality of test transistors TT1-TTn, a first transistor T1, and a second transistor T2. In embodiments illustrated in FIGS. 10A, 10B, and 10C, a gate electrode of the first transistor T1 may be connected to gate electrodes of the plurality of test transistors TT1-TTn and a drain region of the second transistor T2. Because the gate electrode of the first transistor T1 may be connected to the gate electrodes of the plurality of test transistors TT1-TTn, the number of pads used for the test operation using the test element group 500 may be reduced.

Referring to FIG. 10A, a voltage corresponding to a row logic value L may be input to the first transistor T1 and the gate electrodes of the plurality of test transistors TT1-TTn to turn on the first transistor T1 and turn off the plurality of test transistors TT1-TTn. The first transistor T1 may be turned on to charge a voltage of a first node N1 using a power supply voltage VDD. As the voltage of the first node N1 increases, the second transistor T2 may operate as a source-follower amplifier to generate an output current $I_{OUT}$.

Referring to FIG. 10B, a voltage corresponding to a high logic value H may be input to gate electrodes of a first transistor T1 and a plurality of test transistors TT1-TTn, to turn off the first transistor T1 and turn on the plurality of test transistors TT1-TTn. Therefore, as illustrated in FIG. 10C, a voltage of a first node N1 may be discharged through a plurality of test transistors TT1-TTn.

A magnitude of the output current $I_{OUT}$ generated by the second transistor T2 may be determined by the voltage of the first node N1. In the operation illustrated in FIG. 10B, as the first transistor T1 is turned off and the voltage of the first node N1 is decreased, the output current $I_{OUT}$ may also decrease. The decrease characteristic of the output current $I_{OUT}$ may be determined based on the manner in which the voltage of the first node N1 is discharged through the plurality of test transistors TT1-TTn. For example, when the voltage of the first node N1 is rapidly discharged through the plurality of test transistors TT1-TTn, the output current $I_{OUT}$ may be also rapidly reduced, and conversely, when the voltage of the first node N1 slowly discharges, the output current $I_{OUT}$ may slowly decrease.

The test device connected to the test element group 500 may determine whether there is an open fault in at least one of the plurality of test transistors TT1-TTn based on the decrease characteristic of the output current $I_{OUT}$. When there is an open fault in at least one of the plurality of test transistors TT1-TTn, the voltage of the first node N1 may be slowly discharged through the plurality of test transistors TT1-TTn. Therefore, the test device may determine that there is no open fault in the plurality of test transistors TT1-TTn when the output current $I_{OUT}$ rapidly decreases, and determine that an open fault is present in the plurality of test transistors TT1-TTn when the output current $I_{OUT}$ slowly decreases. For example, the test device may determine the presence or absence of an open fault based on the turn-on resistance of the plurality of test transistors TT1-TTn.

Figure 11A:
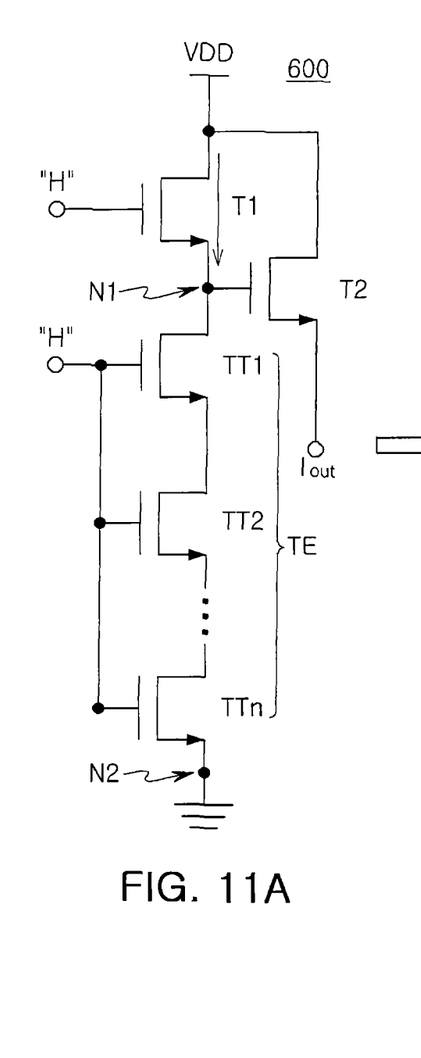
Figure 11B:
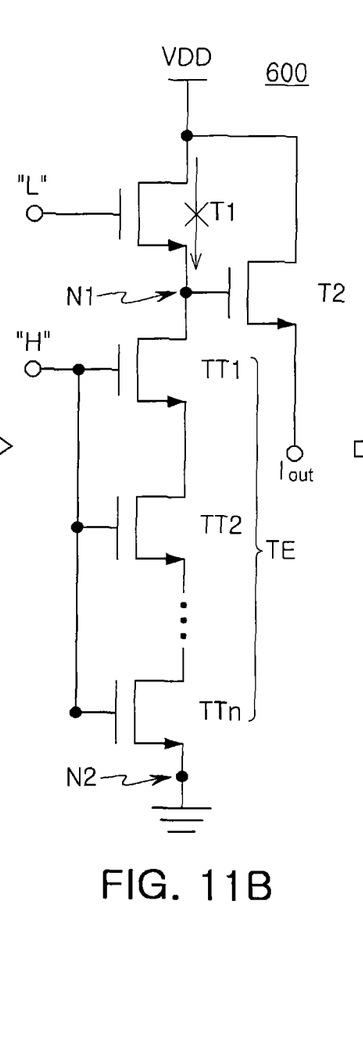
Figure 11C:
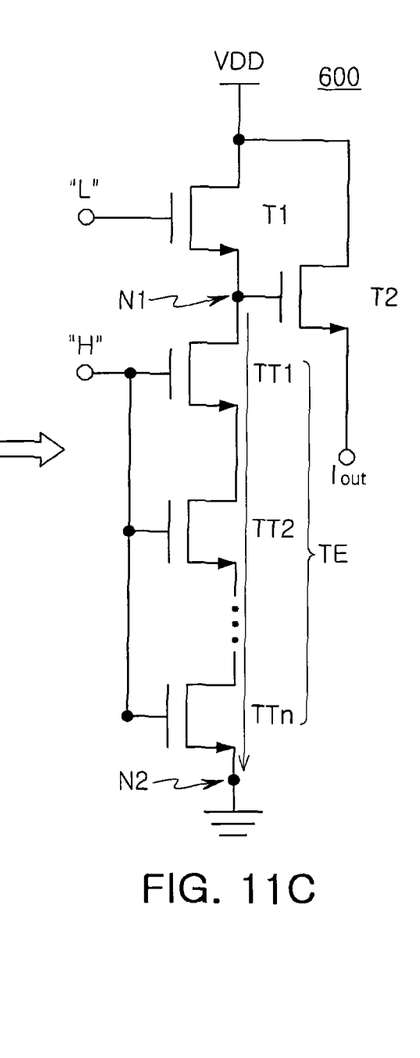

Referring to FIGS. 11A, 11B, and 11C, a test element group 600 may include a test element TE having a plurality of test transistors TT1-TTn, a first transistor T1 and a second transistor T2. In some embodiments illustrated in FIGS. 11A, 11B, and 11C, the first transistor T1 may be implemented as an NMOS transistor.

Referring to FIG. 11A, a voltage corresponding to a high logic value H may be input to a gate electrode of the first transistor T1 and gate electrodes of the plurality of test transistors TT1-TTn to turn on the transistor T1 and the plurality of test transistors TT1-TTn. The first transistor T1 may be turned on to charge a voltage of a first node N1 using a power supply voltage VDD, and the voltage of the node N1 may be kept charged by the high turn-on resistance of the plurality of test transistors TT1-TTn. Also, as the voltage of the first node N1 increases, the second transistor T2 may operate as a source-follower amplifier to generate the output current $I_{OUT}$.

Next, referring to FIG. 11B, a voltage corresponding to the low logic value L may be input to the gate electrode of the first transistor T1 to turn off the first transistor T1. As illustrated in FIG. 11C, the voltage of the first node N1 may be discharged through a plurality of test transistors TT1-TTn operating as pass gates.

Similar to the embodiments described with reference to FIGS. 10A, 10B, and 10C, a magnitude of the output current $I_{OUT}$ generated by the second transistor T2 may be determined by the voltage of the first node N1. In the operation illustrated in FIG. 11B, as the first transistor T1 is turned off and the voltage of the first node N1 is decreased, the output current $I_{OUT}$ may also decrease. For example, when the voltage of the first node N1 is rapidly discharged through the plurality of test transistors TT1-TTn, the output current $I_{OUT}$ may be also rapidly reduced, and conversely, when the voltage of the first node N1 slowly discharges, the output current $I_{OUT}$ may slowly decrease.

As a result, the test device may estimate the turn-on resistance of the plurality of test transistors TT1-TTn based on a decrease characteristic of the output current $I_{OUT}$. The test device may determine that there is an open fault in at least one of the plurality of test transistors TT1-TTn when the turn-on resistance of the plurality of test transistors TT1-TTn is determined to be relatively large.

A test element group according to some embodiments of the inventive concept may include a plurality of test transistors connected in series between a first node and a second node. The plurality of test transistors may be used to verify whether there is an open fault that separates a drain/source region and a contact in at least a portion of the plurality of test transistors by configuring the plurality of test transistors as a discharge path of a voltage of a first node. Accordingly, a degree of integration of a test element group may be increased to carry out a test process for a large number of elements and to improve the accuracy of a test process.

The various advantages and effects of the present inventive concept are not limited to the above description. Moreover, while example embodiments have been shown and described above, it will be apparent to those skilled in the art that modifications and variations could be made without departing from the scope of the present inventive concept as defined by the appended claims.

What is claimed is:

1. A test element group comprising:
a test element comprising a plurality of test transistors connected in series between a first node and a second node, the second node being connected to a reference node;
a first transistor connected between the first node and a power supply node; and
a second transistor connected to the power supply node and having a gate electrode connected to the first node, the second transistor being configured to generate an output current responsive to a voltage at the gate electrode, the voltage at the gate electrode being based on a voltage at the first node, such that the output current is proportional to the voltage at the first node.

2. The test element group according to claim 1, wherein the plurality of test transistors and the second transistor are NMOS transistors, and the first transistor is a PMOS transistor.

3. The test element group according to claim 1, wherein the plurality of test transistors are configured to be in a turned on state during a test operation for the test element.

4. The test element group according to claim 1, wherein gate electrodes of the plurality of test transistors are connected to each other.

5. The test element group according to claim 4, wherein the gate electrodes of the plurality of test transistors are connected to the power supply node during a test operation for the test element.

6. The test element group according to claim 4, wherein the gate electrodes of the plurality of test transistors are connected to a gate electrode of the first transistor.

7. The test element group according to claim 1, further comprising:
a first pad connected to the power supply node;
a second pad connected to gate electrodes of the plurality of test transistors;
a third pad connected to a gate electrode of the first transistor; and
a fourth pad connected to a source region of the second transistor.

8. The test element group according to claim 1, wherein a drain region and a source region of each of the test transistors adjacent to each other among the plurality of test transistors are connected to each other by a metal line.

9. The test element group according to claim 1,
wherein a test operation for the test element is performed by a test device configured to detect the output current and to determine whether an open fault is present in which a drain region and/or a source region in at least one of the plurality of test transistors is separated from a contact based on a decrease characteristic of the output current after the first transistor has transitioned from an on state to an off state.

10. The test element group according to claim 9, wherein the test device is further configured to determine that the open fault is present when a magnitude of the output current is greater than a reference magnitude after the first transistor has transitioned to the off state and a predetermined reference time has elapsed.

11. The test element group according to claim 9, wherein, the plurality of test transistors provide a discharge path for the voltage at the first node when the first transistor has transitioned to the off state.

12. A test element group comprising:
a first transistor configured to control a voltage of a first node and connected between a power supply node and the first node;
a second transistor configured as a source-follower amplifier and having a gate electrode connected to the first node, the second transistor being configured to generate an output current responsive to a voltage at the gate electrode, the voltage at the gate electrode being based on the voltage at the first node, such that the output current is proportional to the voltage of the first node; and
a test element comprising a plurality of test transistors connected in series between the first node and a reference node, wherein the plurality of test transistors provide a discharge path for the voltage of the first node when the first transistor transitions from an on state to an off state.

13. A semiconductor wafer comprising:
a plurality of chip regions comprising a plurality of semiconductor elements; and a separation region between the plurality of chip regions and having a plurality of test element groups, wherein each of the plurality of test element groups comprises:

a first pad configured to receive a power supply voltage;

a test element comprising a plurality of test transistors connected in series between a first node and a second node, gate electrodes of the plurality of test transistors being connected to a second pad, different from the first pad;

a first transistor configured to control a voltage at the first node and having a gate electrode connected to a third pad; and a second transistor having a gate electrode connected to the first node and being configured to generate an output current responsive to a voltage at the gate electrode, the voltage at the gate electrode being based on a voltage at the first node.

14. The semiconductor wafer according to claim 13, wherein at least one of the first pad, the second pad and the third pad are shared by two or more of the test element groups.

15. The semiconductor wafer according to claim 14, wherein the two or more of the test element groups sharing at least one of the first pad, the second pad and the third pad are connected to each other in parallel.

16. The semiconductor wafer according to claim 13, wherein the plurality of test transistors are configured to be turned on responsive to a test operation for the plurality of test element groups generated by a test device, which is configured to detect the output current.

17. The semiconductor wafer according to claim 16, wherein the first transistor is configured to be turned on responsive to the test operation performed by the test device to increase a voltage of the first node, and wherein the first transistor is configured to be turned off responsive to the test operation performed by the test device, the test device being configured to determine that an open fault in at least one of the plurality of test transistors is present when a magnitude of the output current is greater than a reference magnitude after the first transistor is turned off and a predetermined reference time has elapsed.

18. The semiconductor wafer according to claim 17, wherein the open fault is a fault in which a drain region and/or a source region of at least one of the plurality of test transistors are separated from a contact.

19. The semiconductor wafer according to claim 13, wherein the third pad is connected to the gate electrodes of the plurality of test transistors.

20. The semiconductor wafer according to claim 13, wherein the first pad is connected to the gate electrodes of the plurality of test transistors and a drain region of the second transistor, and the output current is output through the third pad.

* * * * *